United States Patent
Ferreira et al.

(10) Patent No.: US 10,718,830 B2
(45) Date of Patent: Jul. 21, 2020

(54) MAGNETORESISTIVE SENSOR

(71) Applicant: INL-International Iberian Nanotechnology Laboratory, Braga (PT)

(72) Inventors: Ricardo Alexandre de Matos Antunes Ferreira, Braga (PT); Elvira Pérez de Colosia Paz, Braga (PT)

(73) Assignee: INL-INTERNATIONAL IBERIAN NANOTECHNOLGY LABORATORY, Braga (PT)

( * ) Notice: Subject to any disclaimer, the term of this patent is extended or adjusted under 35 U.S.C. 154(b) by 69 days.

(21) Appl. No.: 15/579,913

(22) PCT Filed: Jun. 8, 2016

(86) PCT No.: PCT/EP2016/062958
§ 371 (c)(1),
(2) Date: Dec. 5, 2017

(87) PCT Pub. No.: WO2016/198420
PCT Pub. Date: Dec. 15, 2016

(65) Prior Publication Data
US 2018/0180686 A1    Jun. 28, 2018

(30) Foreign Application Priority Data
Jun. 9, 2015   (EP) ..................... 15171162

(51) Int. Cl.
*G01R 33/09* (2006.01)
*H01F 10/32* (2006.01)
(Continued)

(52) U.S. Cl.
CPC ....... *G01R 33/098* (2013.01); *H01F 10/3254* (2013.01); *H01F 10/3272* (2013.01)

(58) Field of Classification Search
CPC ....... G01R 1/00; H01L 21/00; H01L 2221/00; H01F 1/00
See application file for complete search history.

(56) References Cited

U.S. PATENT DOCUMENTS

| 5,862,022 A | 1/1999 | Noguchi et al. |
| 7,977,941 B2 * | 7/2011 | Mather ................ G01R 33/098 324/252 |

(Continued)

FOREIGN PATENT DOCUMENTS

| JP | 2000353307 A | 12/2000 |
| JP | 2001143223 A | 5/2001 |

(Continued)

OTHER PUBLICATIONS

Notification of Reasons for Rejection dated Apr. 19, 2019, issued in corresponding Japanese Patent Application No. 2018-516625 (with English translation) 9 pages.
(Continued)

*Primary Examiner* — Jermele M Hollington
*Assistant Examiner* — Temilade S Rhodes-Vivour
(74) *Attorney, Agent, or Firm* — Xsensus LLP (57) ABSTRACT

A magnetoresistive sensor is provided. The magnetoresistive sensor comprises a magnetic sensing layer, a magnetic reference layer, and a tunnel barrier layer between the magnetic sensing layer and the magnetic reference layer. The magnetoresistive sensor also comprises a sensing exchange layer having a layer of anti-ferromagnetic material. The sensing exchange layer is exchange coupled with the magnetic sensing layer. Also, the magnetoresistive sensor still further comprises a reference exchange layer having a layer of anti-ferromagnetic material. The reference exchange layer is exchange coupled with the magnetic reference layer. Moreover, the magnetoresistive sensor is configured such that in the absence of an external magnetic
(Continued)

field, an exchange bias pinning the reference layer lies along a reference direction, an exchange bias pinning the sensing layer lies along a first direction that is orthogonal to the reference direction, and a magnetic anisotropy of the sensing layer is parallel to the first direction.

12 Claims, 8 Drawing Sheets

(51) Int. Cl.
*G01R 1/00* (2006.01)
*H01L 21/00* (2006.01)

(56) References Cited

U.S. PATENT DOCUMENTS

| | | | |
|---|---|---|---|
| 8,237,437 B2* | 8/2012 | Engel | B82Y 25/00 |
| | | | 324/249 |
| 2002/0196590 A1 | 12/2002 | Saito et al. | |
| 2003/0030945 A1 | 2/2003 | Heinonen et al. | |
| 2003/0189842 A1* | 10/2003 | Deak | G11C 11/16 |
| | | | 365/173 |
| 2003/0206379 A1 | 11/2003 | Lin et al. | |
| 2005/0219773 A1 | 10/2005 | Li et al. | |
| 2006/0187591 A1 | 8/2006 | Gill et al. | |
| 2012/0139649 A1* | 6/2012 | Zhou | H03B 15/006 |
| | | | 331/94.1 |
| 2012/0261777 A1* | 10/2012 | Shukh | H01L 43/08 |
| | | | 257/421 |
| 2014/0111195 A1* | 4/2014 | Kuo | G01R 33/098 |
| | | | 324/252 |

FOREIGN PATENT DOCUMENTS

| | | |
|---|---|---|
| JP | 2005286340 A | 10/2005 |
| JP | 2006228326 A | 8/2006 |
| JP | 2006-269955 A | 10/2006 |
| JP | 2008299995 A | 12/2008 |

OTHER PUBLICATIONS

EP15171162.9, Dec. 10, 2015, Extended European Search Report.
PCT/EP2016/062958, Sep. 26, 2016, International Search Report and Written Opinion.
Extended European Search Report for European Application No. 15171162.9, dated Dec. 10, 2015.
International Search Report and Written Opinion for International Application No. PCT/EP2016/062958, dated Sep. 26, 2016.
Bandiera et al., Comparison of Synthetic Antiferromagnets and Hard Ferromagnets as Reference Layer in Magnetic Tunnel Junctions With Perpendicular Megnetic Anisotropy. IEEE Magnetics Letters. Jan. 1, 2010;1:3000204.
Diouf et al., Anisotropy, Exchange Bias, Dipolar Coupling and Magnetoresistive Response in Nio-Co—$Al_2O_3$—Co Magnetic Tunnel Junctions. Journal of Magnetism and Magnetic Materials. Sep. 1, 2003;265(2):204-14.
Parkin et al., Giant Tunnelling Magnetoresistance at Room Temperature With MgO (100) Tunnel Barriers. Nature Materials. Dec. 1, 2004;3(12):862-67.
Chinese Office Action dated Apr. 10, 2020, issued in corresponding Chinese Patent Application No. 201680033634.4.

* cited by examiner

MAGNETORESISTIVE SENSOR

RELATED APPLICATIONS

This application is a national stage application under U.S.C. § 371 of PCT International Application No. PCT/EP2016/062958, filed Jun. 8, 2016, which claims foreign priority benefits under 35 U.S.C. § 119(a)-(d) or 35 U.S.C. § 365(b) of European application number 15171162.9, filed Jun. 9, 2015, the contents of each of which are incorporated herein by reference in their entireties.

TECHNICAL FIELD

The present disclosure relates in general to free layer biasing in a magnetoresistive sensor, and more particularly to the fabrication of a magnetic tunnel junction sensor having an in stack bias layer providing orthogonal biasing of the sensing layer along the same direction as the magnetic anisotropy of the sensing layer.

BACKGROUND

Magnetoresistive sensors based in thin film multilayer stacks, which exploit the giant magnetoresistive effect or tunnel magnetoresistive effect, have an electrical resistance that depends on the relative orientation between the magnetic moment of a reference ferromagnetic layer (RL) and a sensing ferromagnetic layer (SL). The magnetic moment of the reference ferromagnetic layer is usually fixed by interfacial exchange coupling with an anti-ferromagnetic material such as iridium manganese (IrMn) or platinum manganese (PtMn). This coupling defines a preferred reference direction along which the reference layer is strongly pinned. The resistance of the sensor changes linearly with respect to a magnetic field applied along the reference magnetic layer if in the absence of an external field, the sensing layer magnetic moment lies at 90 degrees with respect to the reference direction, i.e., along the orthogonal direction.

DISCLOSURE OF INVENTION

According to aspects of the present disclosure, a magnetoresistive sensor is provided. The magnetoresistive sensor comprises a magnetic sensing layer, a magnetic reference layer, and a tunnel barrier layer between the magnetic sensing layer and the magnetic reference layer. The magnetoresistive sensor also comprises a sensing exchange layer and a reference exchange layer, each having a layer of anti-ferromagnetic material. The sensing exchange layer is exchange coupled with the magnetic sensing layer. Likewise, the reference exchange layer is exchange coupled with the magnetic reference layer. Moreover, the magnetoresistive sensor is configured such that in the absence of an external magnetic field, an exchange bias pinning the reference layer lies along a reference direction, an exchange bias pinning the sensing layer lies along a first direction that is orthogonal to the reference direction, and the magnetic anisotropy of the sensing layer is parallel to the first direction.

In illustrative implementations, the exchange bias pinning the reference layer in the reference direction, the exchange bias pinning the sensing layer in the first direction that is orthogonal to the reference direction and the magnetic anisotropy of the sensing layer parallel to the first direction, are achieved independent of shape geometry of the magnetoresistive sensor. In this regard, a magnetoresistive sensor is provided, which exhibits improved linearity.

According to further aspects of the present disclosure, a method of fabricating a magnetoresistive sensor is provided. The method comprises forming a magnetoresistive stack by depositing a reference exchange layer having a layer of anti-ferromagnetic material, depositing a magnetic reference layer over the reference exchange layer such that the reference exchange layer is exchange coupled with the magnetic reference layer, depositing a tunnel barrier layer over the magnetic sensing layer, depositing a magnetic sensing layer over the tunnel barrier layer, and depositing a sensing exchange layer having a layer of anti-ferromagnetic material over the magnetic sensing layer such that the sensing exchange layer is exchange coupled with the magnetic sensing layer. The method also comprises setting an exchange bias pinning the reference layer along a reference direction. The method still further comprises setting an exchange bias pinning the sensing layer to lie along a first direction that is orthogonal to the reference direction. The method yet further comprises setting a magnetic anisotropy of the sensing layer to lie parallel to the first direction.

In the method, setting the magnetic anisotropy of the sensing layer to lie parallel to the first direction, may comprise performing a first annealing process by exposing the magnetoresistive stack to a temperature that is sufficient to reset any anisotropy induced during deposition, and exposing the magnetoresistive stack to an external magnetic field in the first direction during a cool down associated with the first annealing process.

In the method, setting an exchange bias pinning the reference layer along a reference direction, may comprise performing a second annealing process after the first annealing process by exposing the magnetoresistive stack to a temperature that is insufficient to reset the magnetic anisotropy of the sensing layer, but sufficient to reset the exchange bias pinning the reference layer, and exposing the magnetoresistive stack to an external magnetic field in the reference direction during a cool down associated with the second annealing process.

In the method, setting an exchange bias pinning the sensing layer to lie along a first direction that is orthogonal to the reference direction, may comprise performing a third annealing process after the second annealing process by exposing the magnetoresistive stack to a temperature that is insufficient to reset the exchange bias pinning the reference layer, but is sufficient to reset the exchange bias pinning the sensing layer, and exposing the magnetoresistive stack to an external magnetic field in the first direction during a cool down associated with the third annealing process.

The following description of various embodiments presently contemplated is made for the purpose of illustrating the general principles and is not meant to limit that claimed herein.

MODES FOR CARRYING OUT THE INVENTION

According to various aspects of the present disclosure, a magnetoresistive sensor is provided, which exhibits improved linearity over conventional magnetoresistive sensors. A magnetoresistive sensor, according to aspects herein, is based in a magnetic tunnel junction stack with combined in-stack biasing of the sensing layer from magnetic anisotropy and sensing layer exchange coupling, both of which lie along a common direction that is orthogonal to a reference direction. The combined action of the magnetic anisotropy and sensing layer exchange coupling creates a well-defined direction along which the free layer rests in the absence of an external field. Under the influence of a magnetic field along the reference direction, the sensing layer magnetization rotates smoothly and uniformly, approaching the ideal behavior expected from a monodomain. Thus, a high quality linear response can be achieved even in large area sensors with no shape anisotropy and in the limit of very weak sensing layer exchange coupling values, which are required to achieve high sensitivity sensors.

Figure 1:
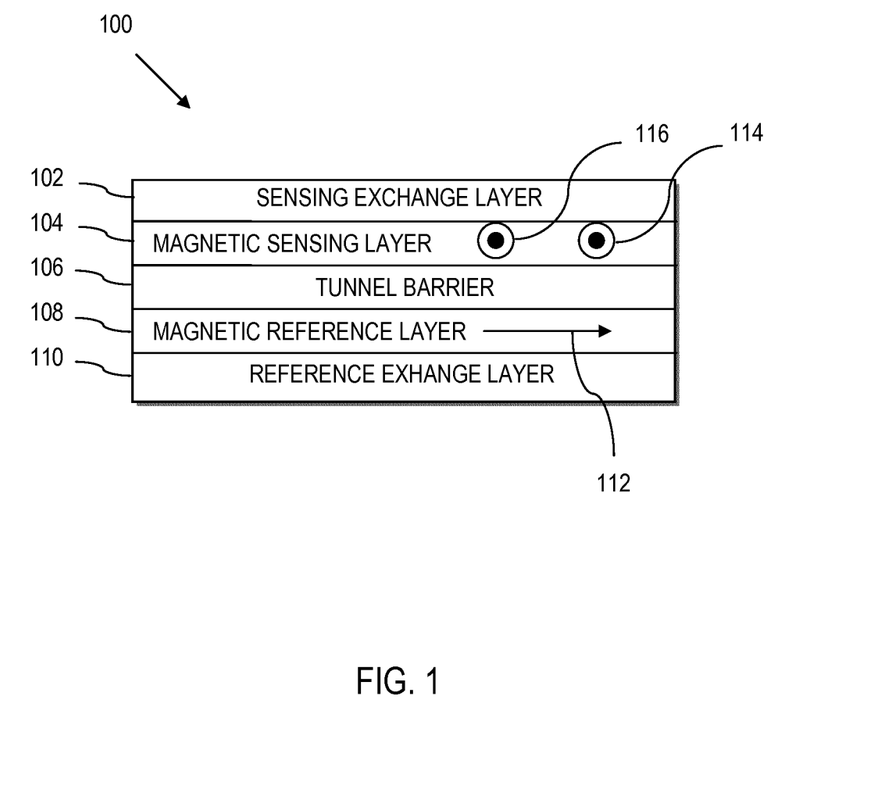
FIG. 1 is an illustration of a magnetoresistive sensor according to aspects of the present disclosure.

Referring now to the drawings and in particular to FIG. 1, a magnetoresistive sensor 100 is illustrated according to aspects of the present disclosure herein. The magnetoresistive sensor 100 is comprised of a series of sandwiched layers, including in stacked form from top to bottom, a sensing exchange layer 102, a magnetic sensing layer 104, a tunnel barrier layer 106, a magnetic reference layer 108 and a reference exchange layer 110.

The sensing exchange layer 102 includes a layer of anti-ferromagnetic material, and is positioned so as to be exchange coupled with the magnetic sensing layer 104. Similarly, the reference exchange layer 110 includes a layer of anti-ferromagnetic material, and is positioned so as to be exchange coupled with the magnetic reference layer 108. In this regard, the tunnel barrier layer 106 is positioned between the magnetic sensing layer 104 and the magnetic reference layer 108. The magnetic sensing layer 104 is positioned between the sensing exchange layer 102 and the tunnel barrier layer 106. Similarly, the magnetic reference layer 108 is positioned between the tunnel barrier layer 106 and the reference exchange layer 110.

Under the above configuration, an exchange bias field strongly pins the magnetic reference layer 108 due to the exchange coupling between the magnetic reference layer 108 and the reference exchange layer 110. This field is referred to herein as a reference exchange field and lies along a reference direction 112. The reference magnetic field should be sufficiently strong so as to pin the reference layer and not allow the reference exchange field of the reference layer 108 to change in the presence of an external magnetic field to be measured by the sensor 100.

An exchange bias field pins the magnetic sensing layer 104 due to the exchange coupling between the magnetic sensing layer 104 and the sensing exchange layer 102. This field is referred to herein as the sensing exchange field and lies along a first direction 114 that is orthogonal to the reference direction 112. Moreover, a magnetic anisotropy of the sensing layer 104 is in a direction 116 that is parallel to the first direction 114, and is thus also orthogonal to the reference direction 112. In the absence of an external magnetic field, the combined action of the sensing exchange field and the magnetic anisotropy forces the magnetization vector of the magnetic sensing layer 104 to lie along the first direction 114 which is orthogonal to the reference direction 112.

Under an external magnetic field applied along the reference direction 112, the magnetization vector of the magnetic sensing layer, which is normally aligned along the first direction 114, rotates smoothly and uniformly providing a linear variation of resistance with respect to the external magnetic field value until saturation is reached.

Figure 2:
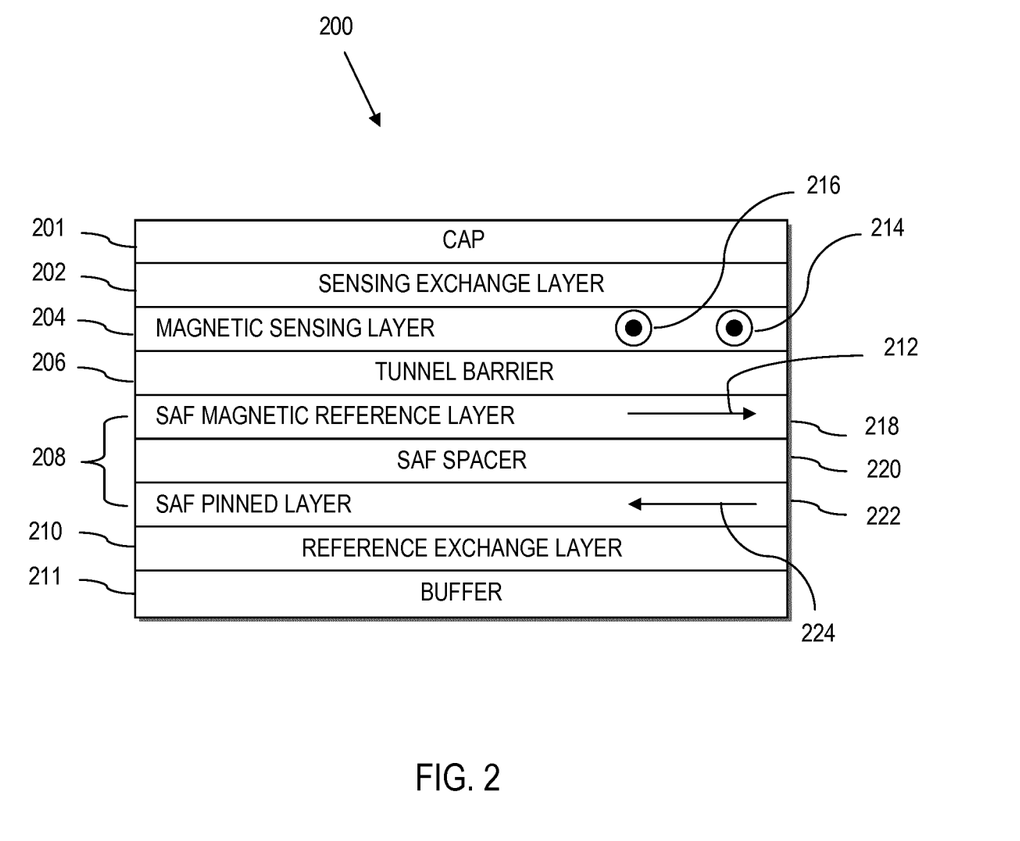
FIG. 2 is an illustration of a magnetoresistive sensor according to further aspects of the present disclosure.

Referring to FIG. 2, a magnetoresistive sensor 200 is illustrated according to further aspects of the present disclosure. The magnetoresistive sensor 200 exhibits the same general properties as the magnetoresistive sensor 100. In this regard, structures that implement like functions are interchangeable in any combination between FIG. 1 and FIG. 2. Accordingly, structures that implement like functions are illustrated with a reference numeral 100 higher in FIG. 2 compared to the counterpart in FIG. 1. Also, any combination of structures and features in the magnetoresistive sensor 100 of FIG. 1 can be implemented with the magnetoresistive sensor 200 of FIG. 2. Likewise, any combination of structures and features in the magnetoresistive sensor 200 of FIG. 2 can be implemented with the magnetoresistive sensor 100 of FIG. 1.

The magnetoresistive sensor 200 is comprised of a series of sandwiched layers, including a cap 201, a sensing exchange layer 202, a magnetic sensing layer 204, a tunnel barrier layer 206, a magnetic reference layer 208, a reference exchange layer 210, and a buffer 211.

As with the example of FIG. 1, the sensing exchange layer 202 includes a layer of anti-ferromagnetic material, and is positioned so as to be exchange coupled with the magnetic sensing layer 204. Similarly, the reference exchange layer 210 includes a layer of anti-ferromagnetic material, and is positioned so as to be exchange coupled with the magnetic reference layer 208.

Moreover, in the example of FIG. 2, the magnetic reference layer 208 is implemented as a synthetic antiferromaget (SAF). For instance, as illustrated, the magnetic reference layer 208 is implemented as a first ferromagnetic layer 218 (SAF reference layer) adjacent to the tunnel barrier layer 206. A non-magnetic spacer 220 (SAF spacer) is adjacent to the first ferromagnetic layer 218, and a second ferromagnetic layer 222 (SAF pinned layer) is adjacent to the non-magnetic spacer 220. Ruderman-Kittel-Kasuya-Yosida (RKKY) coupling of the first ferromagnetic layer 218 and the second ferromagnetic layer 222 mediated through the SAF spacer 220 results in a magnetization of the second ferromagnetic layer 222 in an anti-parallel alignment with the magnetization along a reference direction 212.

More particularly, an exchange bias field pinning the reference layer 208 causes the magnetization vector of the magnetic reference layer 218 to lie along the reference direction 212 such that the reference magnetic layer is strongly pinned along the reference direction 212. The reference exchange field should be sufficiently strong so as to as to pin the reference layer 208 and not allow the magnetization vector of the magnetic reference layer 218 to change in the presence of an external magnetic field to be measured by the sensor 200.

An exchange bias field pinning the sensing layer 204 causes the magnetization vector of the sensing layer 204 to lie along a first direction 214 that is orthogonal to the reference direction 212. Moreover, a magnetic anisotropy of the sensing layer 204 is in a direction 216 that is parallel to the first direction 214, and is thus also orthogonal to the reference direction 212. In the absence of an external magnetic field, the combined action of the sensing exchange field and the magnetic anisotropy forces the magnetization vector of the magnetic sensing layer 204 to lie along the first direction 214 which is orthogonal to the reference direction 212.

Under an external magnetic field applied along the reference direction 212, the sensing magnetic field, which is normally aligned along the first direction 214, rotates smoothly and uniformly providing a linear variation of resistance with respect to the external magnetic field value until saturation is reached.

Also, analogous to the example of FIG. 1, the tunnel barrier layer 206 is positioned between the magnetic sensing layer 204 and the magnetic reference layer 208. The magnetic sensing layer 204 is positioned between the sensing exchange layer 202 and the tunnel barrier layer 206. Similarly, the magnetic reference layer 208 is positioned between the tunnel barrier layer 206 and the reference exchange layer 210. The cap 201 is adjacent to the sensing exchange layer 202 opposite the sensing layer 204, and provides an electrical contact to external circuitry (not shown). Likewise, the buffer 211 is adjacent to the reference exchange layer 210 opposite the reference layer 208, and also provides an electrical contact to external circuitry (not shown).

General Observations:

With reference to FIG. 1 and FIG. 2 generally, the tunnel barrier layer 106, 206 forms a spacer between the sensing layer 104, 204 and the reference layer 108, 208, and may comprise a material such as magnesium oxide (MgO).

The magnetic sensing layer 104, 204, the magnetic reference layer 108, 208, or both can be made from a single ferromagnetic layer, such as cobalt (Co), iron (Fe), nickel (Ni), cobalt-iron (CoFe), cobalt-iron-boron (CoFeB), nickel-iron (NiFe), etc. Alternatively, the magnetic sensing layer 104, 204, the magnetic reference layer 108, 208, or both can be comprised of multiple ferromagnetic layers with anti-ferromagnetic coupling, such as a CoFe/ruthenium (Ru)/CoFeB synthetic anti-ferromagnet trilayer or ferromagnetic coupling, such as CoFeB/CoFe, CoFeB/NiFe, CoFeB/Spacer/NiFe, CoFeB/tantalum (Ta)/NiFe etc.

For instance, in FIG. 2, the magnetic sensing layer 208 can be made of a single magnetic material, such as a CoFeB alloy, or a combination of layers, such as ferromagnetically coupled ferromagnetic layers separated by non-magnetic materials, e.g., CoFeB/Ta/NiFe. For instance, in FIG. 2, the magnetic reference layer 208 is illustrated in an exemplary configuration as a synthetic anti-ferromagnetic material (SAF) tri-layer composed of a SAF pinned Layer, e.g., made of a CoFe alloy, a SAF spacer e.g., made of Ru, and a SAF Reference Layer e.g., made of a CoFeB alloy. Moreover, the uniaxial anisotropy of the ferromagnetic layer(s) making up the sensing layer 104, 204 is along the same direction 116, 216 as the exchange field (see exchange field direction 114, 214) pinning the sensing layer 104, 204, i.e., the uniaxial anisotropy of the sensing layer 104, 204 is along an orthogonal direction to the reference direction 112, 212.

The sensing exchange layer 102, 202, the reference exchange layer 110, 210, or both can be any suitable anti-ferromagnetic material(s) such as an iridium-manganese (IrMn) or platinum-manganese (PtMn) alloy. Regardless, as noted in greater detail herein, the reference exchange layer 110, 210 is used to exchange pin a magnetic field of the reference layer 108, 208 along the reference direction 112, 212 defining the reference magnetic field of the sensor. Similarly, the sensing exchange layer 102, 202 is used to exchange pin a magnetic field of the sensing layer 104, 204 along the first direction 114, 214, which is orthogonal to the reference direction 112, 212 defining the sensing magnetic field of the sensor. Moreover, the orthogonal direction is in a direction parallel to the sensing layer 104, 204, i.e., in the plane of the sensing layer 104, 204 (as opposed to perpendicular.

The cap 201, buffer 211 or both are any suitable material that provides electrical coupling from external circuitry to the magnetoresistive sensor 100, 200. For instance, the cap 201, buffer 211 or both can comprise one more layers of materials such as Ru, Ta, copper-nitrogen (CuN), etc.

Example Magnetoresistive Sensor Stack

Figure 3:
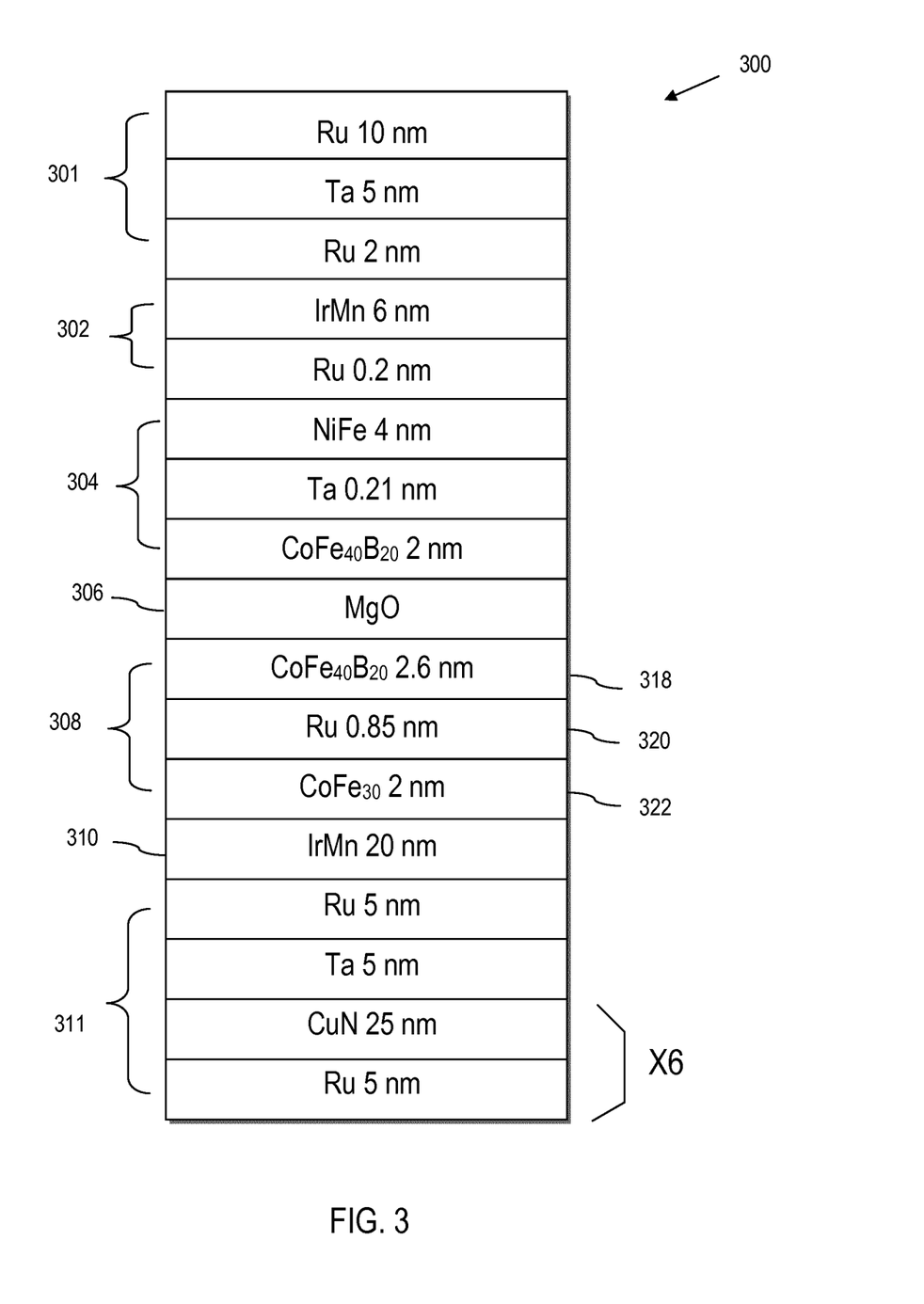
FIG. 3 is an illustration of a magnetoresistive sensor according to still further aspects of the present disclosure.

Referring to FIG. 3, an exemplary implementation of the magnetoresistive sensor of FIG. 2 is illustrated, according to various aspects of the present disclosure. The example stack in FIG. 3 fulfils all the requirements for magnetic field orientations set out herein. Like structure in FIG. 3 is thus illustrated with a reference numeral 100 higher than the counterpart of FIG. 2.

As illustrated, the exemplary magnetoresistive sensor 300 is comprised of a series of sandwiched layers, including a cap 301, a sensing exchange layer 302, a magnetic sensing layer 304, a tunnel barrier layer 306, a magnetic reference layer 308, a reference exchange layer 310, and a buffer 311.

The cap 301 is comprised of three layers, including a 10 nanometer (nm) layer of Ru, a 5 nm layer of Ta and a 2 nm layer of Ru.

The sensing exchange layer 302 is comprised of two layers, including a 6 nm layer of IrMn and a 0.2 nm layer of Ru. In alternative implementations, the sensing exchange layer 302 may comprise a PtMn alloy.

The magnetic sensing layer 304 is comprised of three layers, including a 4 nm layer of nickel iron (NiFe), a 0.21 nm layer of Ta, and a 2 nm layer of cobalt iron boron, such as $CoFe_{40}B_{20}$.

The tunnel barrier layer 306 is magnesium oxide (MgO).

The magnetic reference layer 308 is comprised of three layers that form a synthetic anti-ferromagnetic structure. The synthetic anti-ferromagnetic structure is comprised of a 2.6 nm layer of cobalt iron boron, such as $CoFe_{40}B_{20}$, a 0.85 nm layer of Ru, and a 2 nm layer of cobalt iron, such as $CoFe_{30}$.

The reference exchange layer 310 is comprised of a 20 nm layer of IrMn.

The buffer layer 311 is comprised of a 5 nm layer of Ru and a 5 nm layer of Ta. The buffer layer 311 also includes six stacked layers, each stacked layer including a 25 nm layer of copper nitrate (CuN) and a 5 nm layer of Ru.

In practice, the various material thicknesses and materials themselves can vary from the above example, so long as the resulting structure is configured such that an exchange bias pinning the reference layer lies along a reference direction, an exchange bias pinning the sensing layer lies along a first direction that is orthogonal to the reference direction, and a magnetic anisotropy of the sensing layer is parallel to the first direction.

Figure 4:
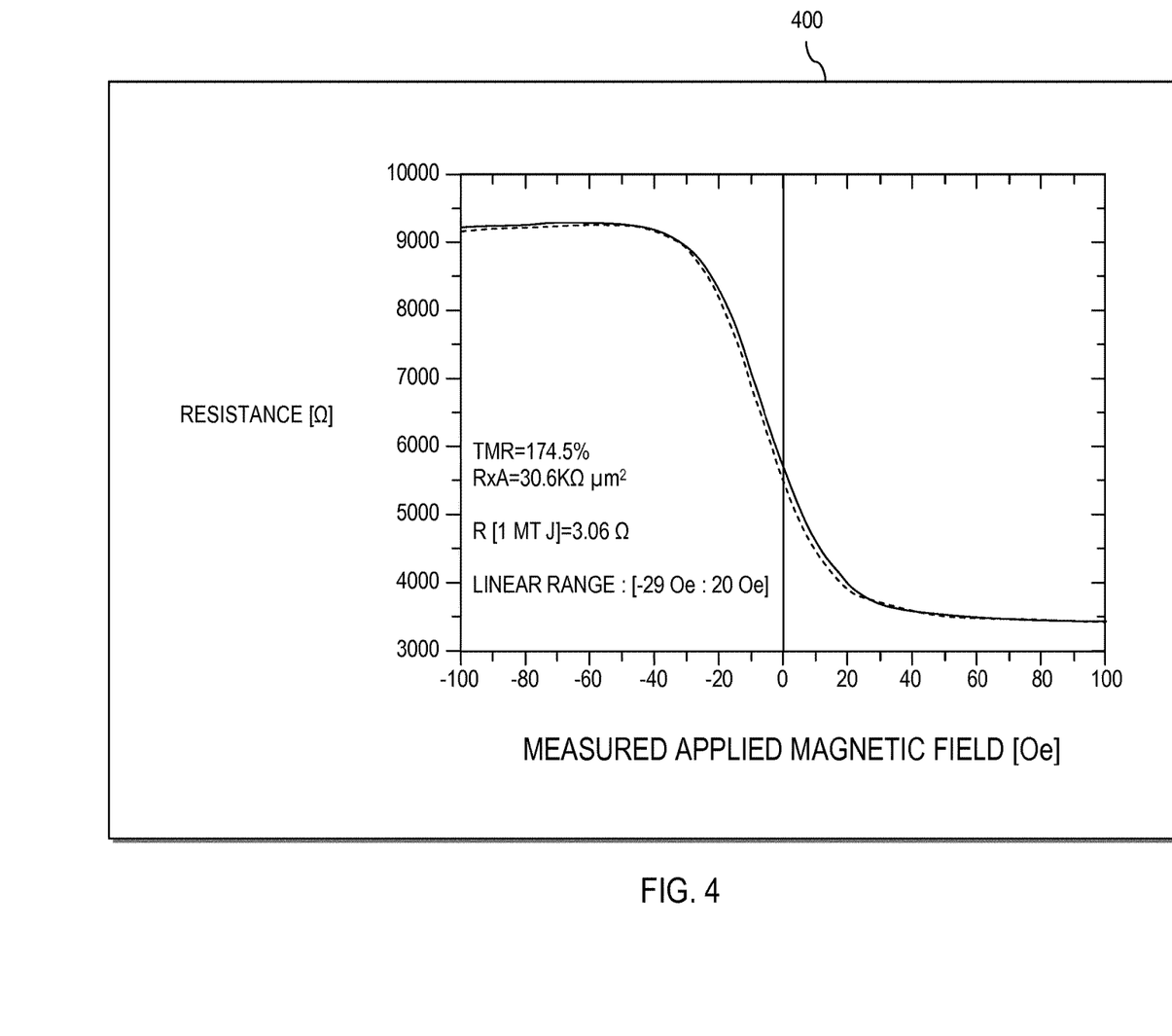
FIG. 4 is a chart illustrating the Measured Applied Magnetic Field on the abscissa and Resistance on the ordinate, for an example implementation of a magnetoresistive sensor according to aspects of the present disclosure.

Referring to FIG. 4, in an example implementation, a process was carried out in which microfabrication and annealing was used to produce a series of magnetic tunnel junction devices (magnetoresistive sensors 300 as described with reference to FIG. 3) with an area of 100×100 µm². The bulk transfer curve of FIG. 4 illustrates that a sensor stack in the above construction will become linear under a field applied along the reference direction, where the coercivity will be in general <1 Oe, and the offset field will be in general <10 Oe. For instance, as the chart 400 of FIG. 4 illustrates, the measured magnetic field was shown to be linear, at least in the range of −29 Oe through 20 Oe. The linear range can be tuned by changing the magnitude of the exchange field pinning the sensing layer, which in turn depends on the thicknesses and composition of the magnetic sensing layer and sensing exchange layer. However, by maintaining the linear range in the order of ~50 Oe (as opposed to 1,000 Oe), the two fields acting in the sensing layer can be made collinear. Thus, the linear range can be selected to avoid competition between the two fields that would otherwise break up the sensing layer in magnetic domains.

Method of Fabricating a Magnetoresistive Sensor

Figure 5:
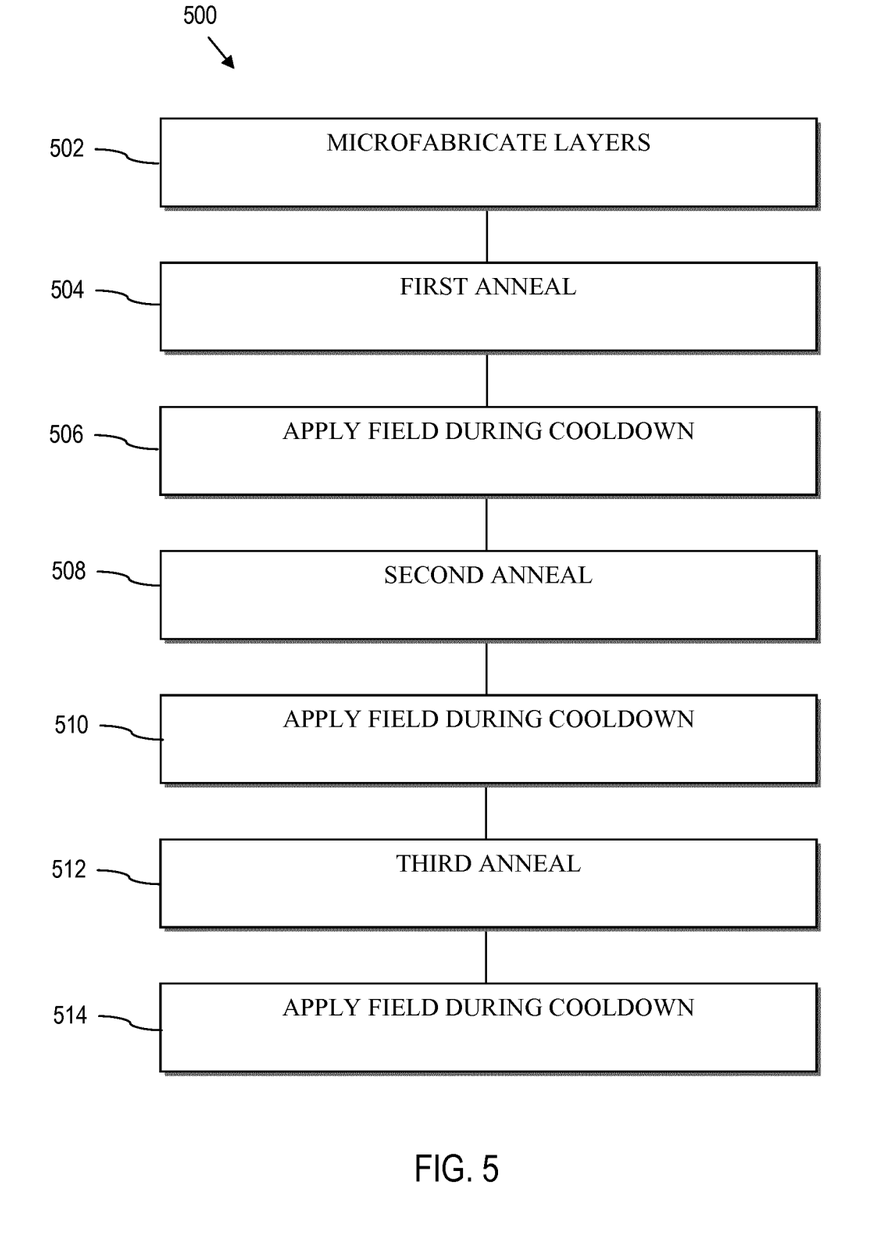
FIG. 5 is a method of fabricating a magnetoresistive sensor according to aspects of the present disclosure herein.

Referring to FIG. 5, a method 500 is illustrated for fabricating a magnetoresistive sensor according to aspects of the present disclosure. The method 500 comprises microfabricating at 502, a magnetoresistive structure. As an example, the method 500 may form a magnetoresistive stack at 502 over a substrate by depositing a reference exchange layer having a layer of anti-ferromagnetic material, depositing a magnetic reference layer over the reference exchange layer such that the reference exchange layer is exchange coupled with the magnetic reference layer, depositing a tunnel barrier layer over the magnetic sensing layer, depositing a magnetic sensing layer over the tunnel barrier layer, and depositing a sensing exchange layer having a layer of anti-ferromagnetic material over the magnetic sensing layer such that the sensing exchange layer is exchange coupled with the magnetic sensing layer. In practice, a buffer layer may also be deposited, e.g., over a substrate, and below the reference exchange layer. Likewise, a cap may be deposited over the sensing exchange layer.

For example, a stack may be constructed through a deposition process using the materials and thicknesses described with reference to FIG. 3. In alternative implementations, other configurations can be utilized, such as by constructing a stack as set out with regard to FIG. 1 or FIG. 2.

As noted in greater detail herein, in the absence of an external magnetic field, an exchange bias pinning the reference layer lies along a reference direction, an exchange bias pinning the sensing layer lies along a first direction that is orthogonal to the reference direction, and a magnetic anisotropy of the sensing layer is parallel to the first direction.

In view of the above, the method 500 also comprises setting a magnetic anisotropy of the sensing layer to lie parallel to the first direction, such as by performing a first annealing process by exposing the magnetoresistive stack to a temperature that is sufficient to reset any anisotropy induced during deposition, and by exposing the magnetoresistive stack to an external magnetic field in the first direction during a cool down associated with the first annealing process.

By way of example, a first annealing process is performed at 504. The first annealing process crystallizes the tunnel barrier and corresponding ferromagnetic layers (e.g., magnetic sensing layer 104, 204, 304, tunnel barrier layer 106, 206, 306 and magnetic reference layer 108, 208, 308, in FIGS. 1, 2 and 3 respectively) participating in the tunneling in the proper phases for tunnel magnetoresistive operation.

Moreover, the first annealing process at 504 may utilize large annealing temperatures above or close to the blocking temperature of the anti-ferromagnetic materials to reset any anisotropy induced during deposition. For instance, large annealing temperatures (T>320 C) are high enough to reset any anisotropy induced during deposition of anti-ferromagnetic materials such as IrMn or PtMn. As such, the first annealing process at 504 may be utilized to set the pinning direction of each anti-ferromagnetic layer (e.g., sensing exchange layer 102, 202, 302 and reference exchange layer 110, 210, 310 in FIGS. 1, 2, and 3, respectively).

Such annealing temperatures can also be utilized to set the uniaxial anisotropy axis of the (ferromagnetic) sensing layer and reference layer in a CoFeB/MgO/CoFeB magnetic tunnel junction stack.

More particularly, the method 500 comprises applying an external magnetic field at 506 proximate to the stack during a cool down operation following the application of heat during the first annealing process. The applied magnetic field is applied along the final orthogonal direction (e.g., the direction 112, 212 described with reference to FIG. 1 and FIG. 2. In particular, the method 500 comprises applying an external magnetic field to the stack utilizing a cool down at 506 to set the uniaxial anisotropy axis of the (ferromagnetic) sensing layer (SL HK).

In addition to setting the uniaxial anisotropy axis of the (ferromagnetic) sensing layer, the applied magnetic field is strong enough to saturate the ferromagnetic reference layer of the stack. That is, for a stack construction such as that described with reference to FIG. 1, the applied external magnetic field should be strong enough to saturate the reference layer 108. For a stack construction such as that described with reference to FIG. 2 and FIG. 3, the applied external magnetic field should be strong enough to saturate the synthetic anti-ferromagnetic structure of the ferromagnetic reference layer 208, 308 of the stack (e.g., layers 218, 220, and 222 or layers 318, 320 and 322). For the example stack configuration described in greater detail with reference to FIG. 3, the applied external magnetic field is preferably >=1 Tesla.

Figure 6A:
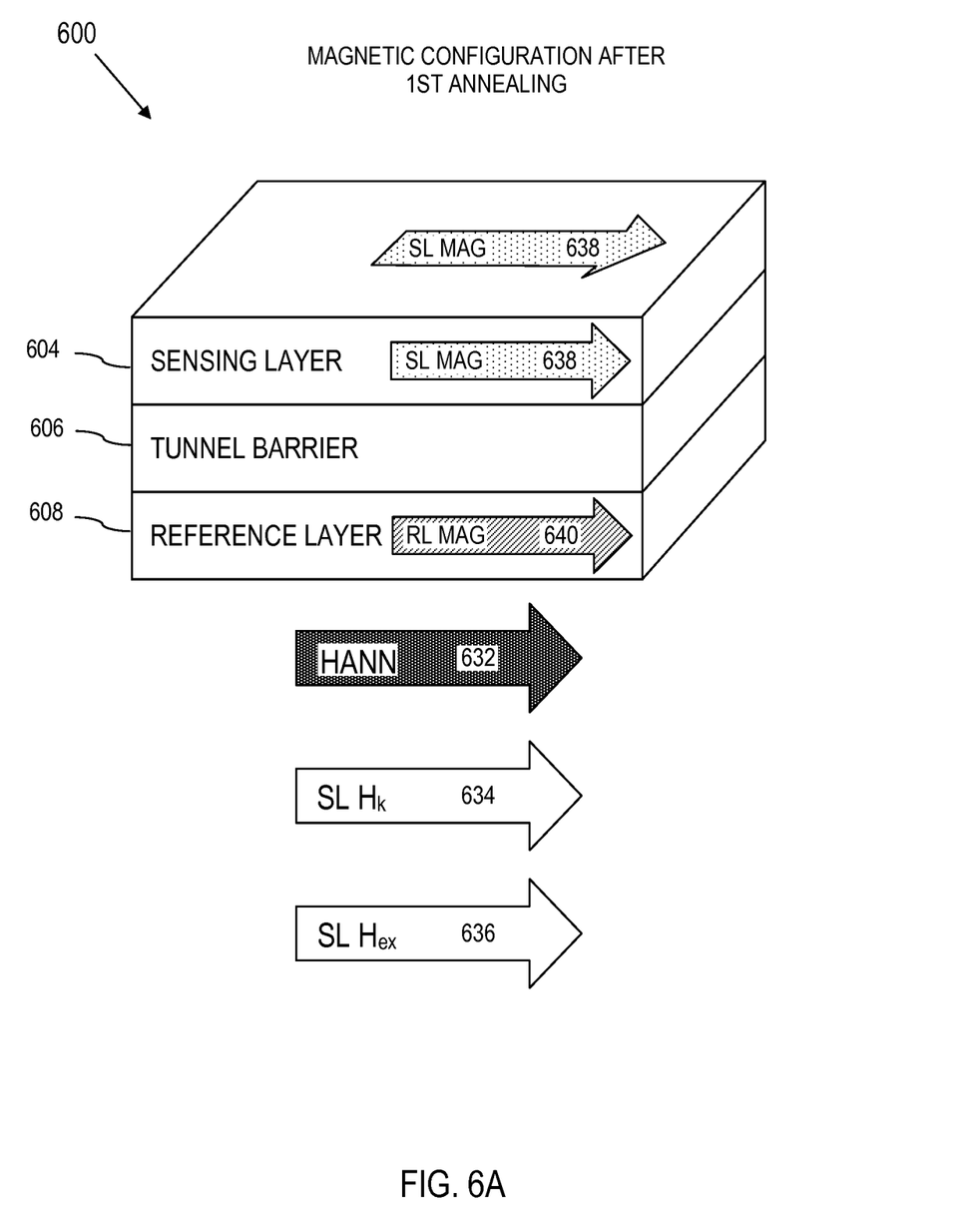
FIG. 6A is an illustration of magnetic fields after a first annealing process including subsequent cool down, of the method of FIG. 5.

With brief reference to FIG. 6A, a representation 600 illustrates the directions of exchange fields and magnetic anisotropies of the magnetoresistive sensor stack at the end of the first annealing process and subsequent cool down. Notably, FIG. 6A illustrates a stack comprised of a sensing layer 604 (analogous to the sensing layer 104, 204, 304 described above), a tunnel barrier layer 606 (analogous to the tunnel barrier layer 106, 206, 306 described above), and a reference layer 608 (analogous to the reference layer 108, 208, 308 described above).

All illustrated exchange fields and magnetic anisotropies of the magnetoresistive sensor stack lie along a direction that will ultimately be orthogonal to the reference direction in the magnetoresistive sensor. More particularly, the external magnetic field (Hann) is set to a direction 632 that will define the orthogonal direction for the sensing magnetic layer and the magnetic anisotropy of the sensing layer in the final stack configuration of the magnetoresistive sensor (directions 114, 116 of FIG. 1, directions 214, 216 of FIG. 2).

As a result, after the initial annealing, the magnetic uniaxial anisotropy axis of each ferromagnetic layer in the stack, and the unidirectional anisotropy associated with each exchange field are oriented along the same direction as the applied external magnetic field. That is, in response to the external magnetic field (Hann), the direction 634 of the uniaxial anisotropy axis of the (ferromagnetic) sensing layer (SL $H_K$), the direction 636 of the exchange bias pinning the sensing layer (SL $H_{ex}$), the direction 638 of the sensing magnetic field (SL Mag), and the direction 640 of the reference layer magnetic field (RL Mag) all align in the same direction. As a result, the direction of the sensing layer magnetization and the direction of the reference layer magnetization will lie along the final device orthogonal direction (e.g., direction 114 of FIG. 1, direction 214 of FIG. 2).

The method 500 of FIG. 5 also comprises setting an exchange bias pinning the reference layer along a reference direction, such as by performing a second annealing process after the first annealing process by exposing the magnetoresistive stack to a temperature that is insufficient to reset the magnetic anisotropy of the sensing layer, but sufficient to reset the exchange bias pinning the reference layer, and by exposing the magnetoresistive stack to an external magnetic field in the reference direction during a cool down associated with the second annealing process.

For instance, referring back to FIG. 5, the method 500 also comprises performing at 508, a second annealing process. The annealing temperature during the second annealing process must be above the blocking temperature of the anti-ferromagnetic layers (e.g., the sensing exchange layer and the reference exchange layer) but below the temperature at which the uniaxial anisotropy of the sensing layer gets reoriented. In an illustrative implementation, a temperature of up to 280 degrees Celsius (T<=280 C) may be utilized during the second annealing process.

In this regard, a cool down at 510 following the application of heat during the second annealing process is used to set the direction of the reference layer magnetic field (RL Mag) to the final reference direction. For instance, the method 500 further comprises applying an external magnetic field proximate to the stack during a cool down operation following the application of heat during the second annealing process. More particularly, the exchange bias at both anti-ferromagnetic material interfaces is rotated by 90 degrees by applying an external magnetic field during the cool down along the reference direction.

For instance, the external magnetic field (Hann) should be strong enough to saturate the ferromagnetic reference layer of the stack. For a stack construction such as that described with reference to FIG. 2 and FIG. 3, the applied external magnetic field during the cool down of the second annealing process (process 510 of FIG. 5) should be strong enough to saturate the synthetic anti-ferromagnetic structure of the ferromagnetic reference layer 208 of the stack (e.g., layers 218, 220, and 222). The applied external magnetic field is preferably >=1 Tesla.

Figure 6B:
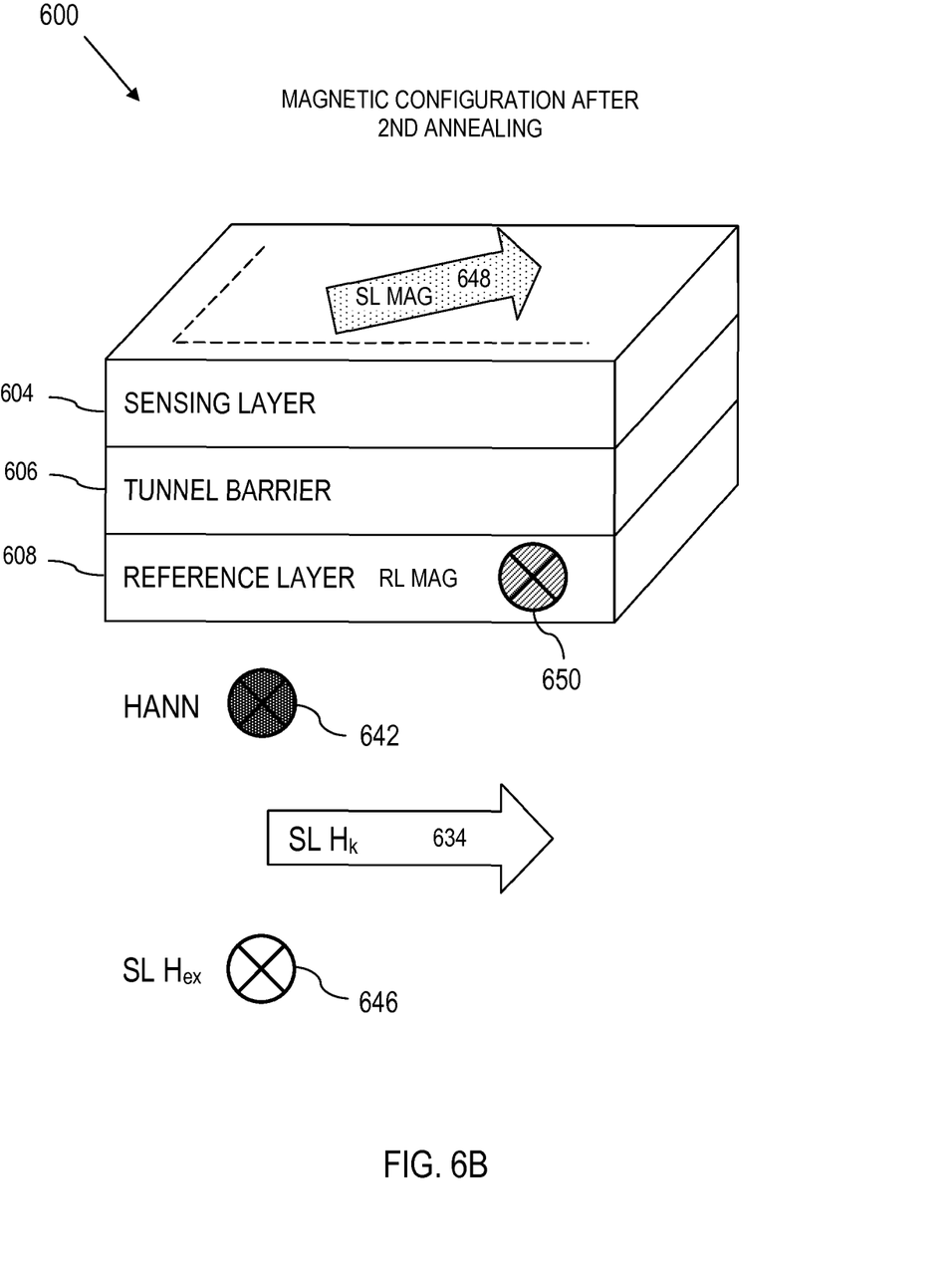
FIG. 6B is an illustration of magnetic fields after a second annealing process including subsequent cool down, of the method of FIG. 5.

With brief reference to FIG. 6B, the representation 600 illustrates the directions of exchange fields and magnetic anisotropies of the magnetoresistive sensor stack (comprising the sensing layer 604, tunnel barrier layer 606 and reference layer 608) at the end of the second annealing process and subsequent cool down.

More particularly, an external magnetic field (Hann) is set to a direction 642 that will define the reference direction for the reference magnetic layer in the final stack configuration of the magnetoresistive sensor (e.g., the direction 112 of FIG. 1, the direction 212 of FIG. 2). In practice, the external magnetic field (Hann) applied at 510 of FIG. 5 may be the same as, or different from the external magnetic field (Hann) applied at 506 of FIG. 5.

In response to the external magnetic field in the direction 642, the direction 634 of the uniaxial anisotropy axis of the (ferromagnetic) sensing layer (SL $H_K$) does not change. That is, the direction 634 of FIG. 6B is the same as the direction 634 of FIG. 6A. However, the direction 646 of the exchange bias pinning the sensing layer (SL $H_{ex}$), and the direction 650 of the reference layer magnetic field (RL Mag) align in the same direction as the direction 642 of the external magnetic field Hann.

The direction 648 of the sensing magnetic field (SL Mag) is affected by both the direction of the uniaxial anisotrophy of the sensing layer and the direction of the exchange bias from the corresponding sensing exchange bias layer. However, the uniaxial anisotrophy of the sensing layer is orthogonal to the exchange bias from the corresponding sensing exchange bias layer. As a result, the direction 648 of the magnetic field of the sensing layer will be somewhere between the direction of the uniaxial anisotrophy of the sensing layer and the direction of the exchange bias from the corresponding sensing exchange bias layer. Thus, the sensing layer magnetization will remain along a direction intermediate between the orthogonal direction and the reference direction. The exact direction will depend on the balance between the uniaxial anisotropy and the exchange field biasing the sensing layer.

Moreover, the direction 650 of the reference layer magnetization will lie along the final device reference direction (e.g., direction 112 of FIG. 1, direction 212 of FIG. 2).

However, according to further aspects of the disclosure herein, the method 500 still further comprises setting an exchange bias pinning the sensing layer to lie along a first direction that is orthogonal to the reference direction, such as by performing a third annealing process after the second annealing process by exposing the magnetoresistive stack to a temperature that is insufficient to reset the exchange bias pinning the reference layer, but is sufficient to reset the exchange bias pinning the sensing layer, and by exposing the magnetoresistive stack to an external magnetic field in the first direction during a cool down associated with the third annealing process.

Referring back to FIG. 5, the method 500 further comprises performing at 512, a third annealing process. For instance, the temperature during the third annealing process may be set to a value below the blocking temperature of the reference exchange layer pinning the reference layer (e.g., the reference exchange layer 110 of FIG. 1, reference exchange layer 210 of FIG. 2) but above the blocking temperature of the sensing exchange layer pinning the sensing layer (e.g., the sensing exchange layer 102 of FIG. 1, sensing exchange layer 202 of FIG. 2). By way of example, the temperature during the third annealing process may be set less than 250 degrees Celsius (T<250 C). In another example, the temperature is set lower than 220 degrees Celsius (T<220 C).

An external magnetic field is applied at 514 during a cool down phase of the third annealing process. During the third annealing process, the exchange bias pinning the sensing layer is rotated 90 degrees, being reoriented along the orthogonal direction. The magnetic anisotropy of the sensing layer will remain undisturbed along the orthogonal direction. The exchange bias pinning the reference layer will remain undisturbed along the reference direction. Accordingly, the direction of magnetization of the reference layer will not be affected.

Figure 6C:
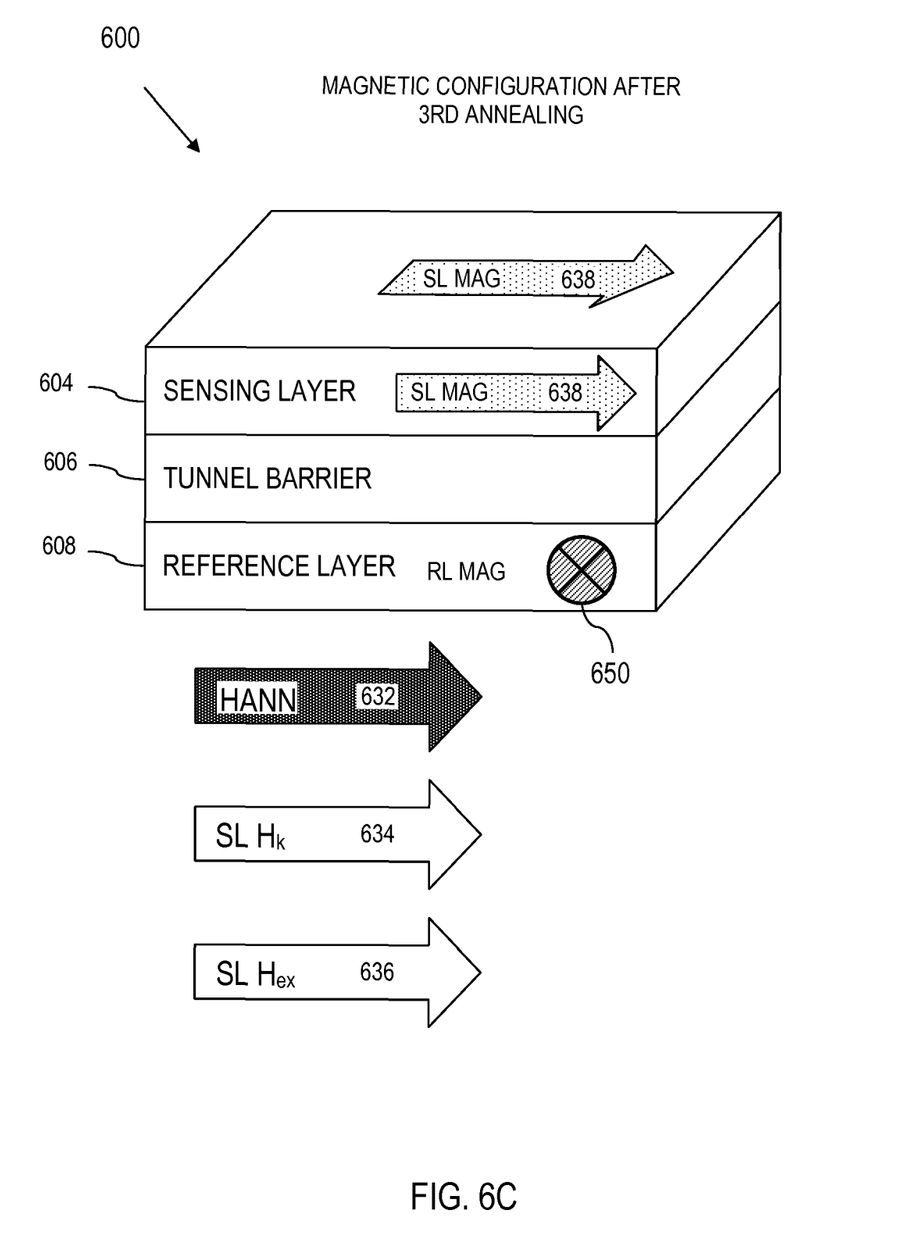
FIG. 6C is an illustration of magnetic fields after a third annealing process including subsequent cool down, of the method of FIG. 5.

With brief reference to FIG. 6C, the representation 600 illustrates the directions of exchange fields and magnetic anisotropies of the magnetoresistive sensor stack (comprising the sensing layer 604, tunnel barrier layer 606 and reference layer 608) at the end of the third annealing process and subsequent cool down. More particularly, an external magnetic field (Hann) is set to the direction 632 corresponding to the orthogonal direction (same as the direction 632 of the external magnetic field (Hann) described with reference to FIG. 6A).

In practice, the external magnetic field (Hann) may be the same as, or different from the external magnetic field applied in the direction 632 during the cool down of the first annealing process 504 of FIG. 5. For instance, in an exemplary implementation, the cool down external magnetic field (Hann) is applied in the direction 632 (along the orthogonal direction) and must be large enough to saturate the sensing layer 604, e.g., the cool down field value may be <0.1 Tesla.

In response to the external magnetic field (Hann) in the direction 632, the direction 804 of the uniaxial anisotropy axis of the (ferromagnetic) sensing layer (SL $H_K$) again does not change (and thus remains in the orthogonal direction). However, the direction 636 of the exchange bias pinning the sensing layer (SL $H_{ex}$) once again aligns in the same direction as the direction 632 of the external magnetic field Hann.

The direction of the reference layer magnetic field (RL Mag) is unaffected by the external magnetic field Hann applied at 514 of FIG. 5. As such, the reference layer magnetic field (RL Mag) remains in the reference direction 650.

The direction of the sensing magnetic field (SL Mag) is affected by both the direction of the uniaxial anisotrophy of the sensing layer and the direction of the exchange bias from the corresponding sensing exchange bias layer. Both the uniaxial anisotrophy of the sensing layer and the exchange bias from the corresponding sensing exchange bias layer are aligned in the same direction (the orthogonal direction). As a result, the direction of the sensing magnetic field (SL Mag) is once again in the direction 638, which is in the orthogonal direction.

With reference back to FIG. 5, the third annealing step 512 and cooldown 514 are required to set the sensing layer exchange and the reference layer exchange in an orthogonal configuration. This could be achieved by eliminating the second annealing 508 and cooldown 510 from the process 500 and by applying the cooldown field in step 514 along the direction orthogonal to the first direction. In such a process, the two internal fields acting in the sensing layer (magnetic anisotropy and exchange bias) would not be collinear. The competition between these two fields would displace the magnetic moment of the sensing layer from the orthogonal direction which in turn would degrade the linearity of the sensor in response to a field along the reference direction. The sensing layer would become canted (in a configuration similar to that shown in FIG. 6C) and the transfer curves would exhibit a curvature which would have an especially meaningful impact in sensors with high sensitivities (where the order of magnitude of the two competing field would become similar).

Miscellaneous:

There are numerous applications that require a linear resistance variation of a magnetoresistive device with respect to an external magnetic field. To achieve a linear response, the sensing layer magnetic moment is directed along a direction orthogonal to the reference layer in the absence of an external magnetic field.

Aspects of the present disclosure provide a magnetic field sensor based in a magnetic tunnel junction stack with a tunnel barrier and ferromagnetic layers (such as MgO and CoFeB in CoFeB/MgO/CoFeB magnetic tunnel junctions) utilizing a high annealing temperature (e.g., T>280 C) and multiple annealing processes in order to provide good magneto-transport properties that facilitate linear operation over at least a region of the bulk transfer curve. In order to achieve the configurations described herein the two anti-ferromagnetic layers may have a different blocking temperature so that separate magnetic annealing procedures can be used to selectively set the pinning direction of each layer.

More particularly, as described herein, in illustrative implementations, depending upon fabrication technique, the blocking temperature associated with the exchange bias at the interface between the sensing exchange layer (e.g., anti-ferromagnetic material) and the magnetic sensing layer may be different from the blocking temperature associated with the exchange at the interface from the reference exchange layer and the magnetic reference layer, e.g., the SAF pinned layer as illustrated in FIG. 2. Furthermore, the magnetic anisotropy associated with the magnetic sensing layer 204, once set, must remain stable at the blocking temperature associated with the exchange bias at the interface between the sensing exchange layer and the magnetic sensing layer, and at the blocking temperature associated with the exchange at the interface from the reference exchange layer and the magnetic reference layer.

With the uniaxial anisotropy of the sensing layer along the reference direction, in the absence of a magnetic field, the spins at the anti-ferromagnetic/sensing layer interface (e.g., the interface between the sensing exchange layer 102 and the magnetic sensing layer 104 of FIG. 1, the sensing exchange layer 202 and the magnetic sensing layer 204 of FIG. 2) will become blocked in the reference direction. That is, the sensor will lose the magnetic configuration providing linear response. However, in the disclosed structures herein, the sensing layer magnetic moment remains aligned along the orthogonal direction, facilitating linear performance in response to an external magnetic field to be measured by the sensor.

In illustrative implementations, magnetic field sensors with good linear response and thermal stability are provided, by implementing a linearization method which takes into account the uniaxial anisotropy of the sensing layer, e.g., as described with reference to FIG. 5-FIG. 6C herein.

Notably, the structures illustrated herein are fabricated to exhibit linearity and thermal stabilization independent of shape anisotropy. That is, the exchange bias pinning the reference layer lies along a reference direction, whereas the exchange bias pinning the sensing layer lies along a first direction that is orthogonal to the reference direction and the magnetic anisotropy of the sensing layer is parallel to the first direction (absent the presence of an external magnetic field) without requiring a large aspect ratio and a small lateral dimension. Rather, the above-magnetic field properties are realized, even with a large lateral dimension regardless of the aspect ratio (e.g., 100×10 $\mu m^2$ to 10×10 $\mu m^2$) but also with small lateral dimension regardless of the aspect ratio (e.g., 100×2 $\mu m^2$ down to 2×2 $\mu m^2$). Thus, for example, the magnetic sensing layer may have a dimension defined by an aspect ratio that can be as small as 1:1. This ability allows high sensitivity linear sensors with a small linear range to be fabricated in a small area not otherwise possible with conventional sensors (e.g., a 2×2 $\mu m^2$ square sensor). Moreover, the structures and methods herein enable independence between sensor geometry while still retaining linearity. Thus for instance, the sensors herein are not limited to a small lateral dimension and may be >5 μm. Moreover, the linear range and the sensor dimensions are not independent parameters.

Sensors constructed as set out herein, are suitable in applications that require magnetic field sensors with a relatively large area and/or low aspect ratio, such as those concerning the detection of very weak magnetic fields in the low frequency range.

Moreover, as noted in greater detail herein, the exchange bias pinning the reference layer lies along a reference direction, whereas the exchange bias pinning the sensing layer lies along a first direction that is orthogonal to the reference direction and the magnetic anisotropy of the sensing layer is parallel to the first direction, in the absence of an external magnetic field. As such, there is no need to rely upon magnetic field biasing from permanent magnets not included in the magnetoresistive sensor stack as described herein.

For instance, the structures herein avoid biasing of the sensing layer by hard magnetic layers formed in the vicinity of the sensor. Using hard magnetic layers such as CoCrPt or CoZrNb, generate stray magnetic fields used to align the magnetic moment of the sensing layer in the direction orthogonal to the reference layer, without pinning it. The biasing field provided by such schemes is uneven across the sensing layer (thus inadequate to stabilize it in some application). Moreover, the intensity of the biasing field when relying upon magnetic layers formed in the vicinity of the sensor is strongly dependent on the geometry used and the thermal stability of the sensor is limited by the thermal stability of the permanent magnet.

Likewise, there is no need to rely upon a magnetic bias from inbound magnetic layers pining the sensing layer, or otherwise relying upon in stack biasing using stray magnetic fields originating from ferromagnetic layers included in the stack other than those in the reference layer.

Moreover, the structures herein do not need to rely upon in stack biasing with exchange coupling in the orthogonal direction. To the contrary, as described herein, an exchange bias pinning the sensing layer lies along a first direction that is orthogonal to the reference direction and a magnetic anisotropy of the sensing layer is parallel to the first direction.

Moreover, the approaches set out herein avoid the competition between the exchange bias and the uniaxial anisotropy in the sensing layer as both fields are aligned in the same direction. This improves both linearity and thermal performance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure.

Having thus described the disclosure of the present application in detail and by reference to embodiments thereof, it will be apparent that modifications and variations are possible without departing from the scope of the disclosure defined in the appended claims.

The invention claimed is:

1. A magnetoresistive sensor, comprising a magnetic sensing layer;
   a magnetic reference layer;
   a tunnel barrier layer between the magnetic sensing layer and the magnetic reference layer;
   a sensing exchange layer having a layer of anti-ferromagnetic material, the sensing exchange layer exchange coupled with the magnetic sensing layer; and
   a reference exchange layer having a layer of anti-ferromagnetic material, the reference exchange layer exchange coupled with the magnetic reference layer;
   wherein, in the absence of an external magnetic field:
      an exchange bias pinning the magnetic reference layer es along a reference direction;
      an exchange bias pinning the magnetic sensing layer lies along a first direction that is orthogonal to the reference direction; and
      a magnetic anisotropy of the magnetic sensing layer is parallel to the first direction.

2. The magnetoresistive sensor according to claim 1, wherein:
   the magnetic sensing layer has a dimension defined by an aspect ratio that can be as small as 1:1.

3. The magnetoresistive sensor according to claim 1, wherein:
   the magnetic reference layer is implemented with a synthetic anti-ferromagnetic material.

4. The magnetoresistive sensor according to claim 1, wherein:
   the magnetic sensing layer is made of two ferromagnetic materials separated by a thin non-magnetic material with thickness <1 nm.

5. The magnetoresistive sensor according to claim 1, wherein:
   a thin non-magnetic layer with thickness <1 nm is positioned between the magnetic sensing layer and the sensing exchange layer.

6. A method of fabricating a magnetoresistive sensor, comprising:
   forming a magnetoresistive stack by:
      depositing a reference exchange layer having a layer of anti-ferromagnetic material;
      depositing a magnetic reference layer over the reference exchange layer such that the reference exchange layer is exchange coupled with the magnetic reference layer;
      depositing a tunnel barrier layer over the magnetic sensing layer;
      depositing a magnetic sensing layer over the tunnel barrier layer; and
   depositing a sensing exchange layer having a layer of anti-ferromagnetic material over the magnetic sensing layer such that the sensing exchange layer is exchange coupled with the magnetic sensing layer;
   setting an exchange bias pinning the magnetic reference layer along a reference direction;
   setting an exchange bias pinning the magnetic sensing layer to lie along a first direction that is orthogonal to the reference direction; and
   setting a magnetic anisotropy of the magnetic sensing layer to lie parallel to the first direction.

7. The method according to claim 6, wherein:
setting a magnetic anisotropy of the magnetic sensing layer to lie parallel to the first direction, comprises:
  performing a first annealing process by exposing the magnetoresistive stack to a temperature that is sufficient to reset any anisotropy induced during deposition; and
  exposing the magnetoresistive stack to an external magnetic field in the first direction during a cool down associated with the first annealing process.

8. The method according to claim 7, wherein:
the magnetic sensing layer comprises CoFeB, the tunnel barrier layer comprises MgO, and the magnetic reference layer comprises CoFeB;
performing a first annealing process by exposing the magnetoresistive stack to a temperature that is sufficient to reset any anisotropy induced during deposition, comprises:
  setting the temperature in excess of 320 degrees Celsius during the first annealing process; and
exposing the magnetoresistive stack to an external magnetic field, comprises:
  applying the external magnetic field at a field value greater than or equal to One Tesla.

9. The method according to claim 7, wherein:
setting an exchange bias pinning the magnetic reference layer along a reference direction, comprises:
  performing a second annealing process after e first annealing process by exposing the magnetoresistive stack to a temperature that is insufficient to reset the magnetic anisotropy of the magnetic sensing layer, but sufficient to reset the exchange bias pinning the magnetic reference layer; and
  exposing the magnetoresistive stack to an external magnetic field in the reference direction during a cool down associated with the second annealing process.

10. The method according to claim 9, wherein:
performing a second annealing process after the first annealing process by exposing the magnetoresistive stack to a temperature that is insufficient to reset the magnetic anisotropy of the magnetic sensing layer, but sufficient to reset the exchange bias pinning the magnetic reference layer, comprises:
  setting the temperature up to 280 degrees Celsius during the second annealing process; and
exposing the magnetoresistive stack to an external magnetic field, comprises:
  applying the external magnetic field at a field value greater than or equal to one Tesla.

11. The method according to claim 8, wherein:
setting an exchange bias pinning the magnetic sensing layer to lie along a first direction that is orthogonal to the reference direction, comprises:
  performing a third annealing process after the second annealing process by exposing the magnetoresistive stack to a temperature that is insufficient to reset the exchange bias pinning the magnetic reference layer, but is sufficient reset the exchange bias pinning the magnetic sensing layer; and
  exposing the magnetoresistive stack to an external magnetic field in the first direction during a cool down associated with the third annealing process.

12. The method of claim 11, wherein:
performing a third annealing process after the second annealing process by exposing the magnetoresistive stack to a temperature that is insufficient to reset the exchange bias pinning the magnetic reference layer, but is sufficient to reset the exchange bias pinning the magnetic sensing layer, comprises:
setting the temperature during the third annealing process to a temperature less than 250 degrees Celsius.

* * * * *